United States Patent
Lee et al.

(10) Patent No.: US 12,188,650 B2
(45) Date of Patent: Jan. 7, 2025

(54) LIGHTING DEVICE

(71) Applicant: LG INNOTEK CO., LTD., Seoul (KR)

(72) Inventors: Jung Ju Lee, Seoul (KR); Sa Rum Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/408,067

(22) Filed: Jan. 9, 2024

(65) Prior Publication Data
US 2024/0142082 A1    May 2, 2024

Related U.S. Application Data

(63) Continuation of application No. 17/830,666, filed on Jun. 2, 2022, now Pat. No. 11,906,149, which is a (Continued)

(30) Foreign Application Priority Data

Aug. 16, 2018    (KR) .......................... 10-2018-0095319

(51) Int. Cl.
*F21V 3/08*    (2018.01)
*F21K 9/64*    (2016.01)
(Continued)

(52) U.S. Cl.
CPC .................. *F21V 3/08* (2018.02); *F21K 9/64* (2016.08); *F21K 9/65* (2016.08); *H01L 27/156* (2013.01);
(Continued)

(58) Field of Classification Search
CPC . F21V 3/08; F21V 31/005; F21K 9/64; F21K 9/65; H01L 27/156; H01L 33/54;
(Continued)

(56) References Cited

U.S. PATENT DOCUMENTS

| 8,288,937 B2 | 10/2012 | Ishii et al. |
| 8,426,882 B2 | 4/2013 | Sakai et al. |
| (Continued) | | |

FOREIGN PATENT DOCUMENTS

| EP | 2 469 613 | 6/2012 |
| JP | 2001-229721 | 8/2001 |
| (Continued) | | |

OTHER PUBLICATIONS

International Search Report dated Nov. 12, 2019 issued in Application No. PCT/KR2019/009524.
(Continued)

*Primary Examiner* — Zheng Song
*Assistant Examiner* — Glenn D Zimmerman
(74) *Attorney, Agent, or Firm* — KED & Associates LLP

(57) ABSTRACT

A lighting device includes a substrate, light sources having a first light source on the substrate, a resin layer sealing the plurality of light sources on the substrate; and a light transmitting layer on the resin layer. A surface of the resin layer has an upper surface and side surfaces, and the side surfaces of the resin layer has a convex curved surface. The light transmitting layer has a first flat region on the upper surface of the resin layer and a second curved region on the side surfaces of the resin layer. The convex curved surface of the resin layer and the second curved region of the light transmitting layer overlap the first light source in a vertical direction, and a corner between two adjacent the side surfaces of the resin layer has a convex curved surface.

20 Claims, 4 Drawing Sheets

Related U.S. Application Data continuation of application No. 17/264,064, filed as application No. PCT/KR2019/009524 on Jul. 31, 2019, now Pat. No. 11,378,252.

(51) Int. Cl.
*F21K 9/65* (2016.01)
*F21Y 105/10* (2016.01)
*H01L 27/15* (2006.01)
*H01L 33/50* (2010.01)
*H01L 33/54* (2010.01)
*F21Y 115/10* (2016.01)

(52) U.S. Cl.
CPC .......... *H01L 33/54* (2013.01); *F21Y 2105/10* (2016.08); *F21Y 2115/10* (2016.08); *H01L 33/505* (2013.01)

(58) Field of Classification Search
CPC . H01L 33/505; H01L 25/0753; H01L 33/507; H01L 33/486; F21Y 2105/10; F21Y 2115/10
See application file for complete search history.

(56) References Cited

U.S. PATENT DOCUMENTS

| | | | |
|---|---|---|---|
| 8,592,836 B2 | 11/2013 | Yokotani et al. | |
| 8,622,574 B2 | 1/2014 | Liu | |
| 8,928,021 B1* | 1/2015 | Bibl | G02B 6/0096 257/E33.072 |
| 9,082,946 B2 | 7/2015 | Vdovin et al. | |
| 9,200,757 B2 | 12/2015 | Ariyoshi et al. | |
| 9,748,452 B2 | 8/2017 | Kim et al. | |
| 10,231,305 B2 | 3/2019 | Yamakawa et al. | |
| 11,387,395 B2 | 7/2022 | Yun | |
| 2006/0157724 A1* | 7/2006 | Fujita | B29C 39/10 257/E33.059 |
| 2010/0308356 A1 | 12/2010 | Wirth | |
| 2011/0006334 A1 | 1/2011 | Ishii et al. | |
| 2012/0014115 A1 | 1/2012 | Park et al. | |
| 2012/0043573 A1 | 2/2012 | Mitsuishi et al. | |
| 2012/0153313 A1 | 6/2012 | Yokotani et al. | |
| 2013/0334559 A1* | 12/2013 | Vdovin | H01L 33/58 257/98 |
| 2014/0367633 A1* | 12/2014 | Bibl | H01L 33/56 257/13 |
| 2014/0367711 A1 | 12/2014 | Bibl et al. | |
| 2016/0146433 A1* | 5/2016 | Bukesov | G02B 26/123 427/67 |
| 2017/0162553 A1* | 6/2017 | Bibl | G02F 1/133617 |
| 2021/0193635 A1 | 6/2021 | Lee et al. | |

FOREIGN PATENT DOCUMENTS

| | | |
|---|---|---|
| JP | 2012-134305 A | 7/2012 |
| JP | 2014-515863 A | 7/2014 |
| JP | 2016-157795 A | 9/2016 |
| JP | 2016-219215 | 12/2016 |
| KR | 20-2009-0000447 | 7/2009 |
| KR | 10-2010-0068446 | 6/2010 |
| KR | 10-2011-0018391 | 2/2011 |
| KR | 10-2011-0035849 | 4/2011 |
| KR | 10-2015-0008959 | 1/2015 |
| KR | 20150089232 | 8/2015 |
| KR | 10-2015-0107072 | 9/2015 |
| KR | 20200029900 | 3/2020 |
| WO | WO 2009/144922 | 12/2009 |
| WO | WO 2012/120434 | 9/2012 |
| WO | WO 2013/024911 | 2/2013 |
| WO | WO 2016/2086683 A1 | 4/2018 |

OTHER PUBLICATIONS

Notice of Allowance dated Mar. 2, 2022 issued in parent U.S. Appl. No. 17/264,064.
European Search Report dated Apr. 20, 2022 issued in EP Application No. 19849394.2.
Japanese Office Action dated Oct. 3, 2023 issued in Application 2021-507643.
Extended European Search Report dated Oct. 19, 2023 issued in Application 23188482.6.
U.S. Notice of Allowance dated Oct. 13, 2023 issued in parent U.S. Appl. No. 17/830,666.
U.S. Office Action dated Jun. 29, 2023 issued in parent U.S. Appl. No. 17/830,666.
U.S. Office Action dated Feb. 15, 2023 issued in parent U.S. Appl. No. 17/830,666.

* cited by examiner

LIGHTING DEVICE

CROSS-REFERENCE TO RELATED APPLICATIONS

This application is a Continuation application of U.S. patent application Ser. No. 17/830,666 filed Jun. 2, 2022, which is a Continuation application of U.S. patent application Ser. No. 17/264,064 filed Jan. 28, 2021, now U.S. Pat. No. 11,378,252, which is a U.S. National Stage Application under 35 U.S.C. § 371 of PCT Application No. PCT/KR2019/009524, filed Jul. 31, 2019, which claims priority to Korean Patent Application No. 10-2018-0095319, filed Aug. 16, 2018, whose entire disclosures are hereby incorporated by reference

BACKGROUND

1. Field

An embodiment relates to a lighting device for surface light emission to improve light efficiency.

2. Background

In general, light emitting devices such as light emitting diodes (LED) have advantages such as low power consumption, semi-permanent life, fast response speed, safety, and environmental friendliness compared to conventional light sources such as fluorescent lamps and incandescent lamps. Such light emitting diodes are applied to various display devices, various lighting devices such as indoor or outdoor lights.

Recently, as a vehicle light source, a lamp employing a light emitting device has been proposed. Compared with an incandescent lamp, the light emitting device is advantageous in that power consumption is small. Since the light emitting device is small, it can increase the design freedom of the lamp, and it is economical due to its semi-permanent life.

Such a vehicle lighting device uses a surface light source lighting device, thereby creating a three-dimensional effect and a unique aesthetic sense of a vehicle lamp.

Conventional lighting devices of a surface light source consist of a polyhedron whose upper surface and side surface are bent. Since the distance between the upper surface and the side surface is considerably far from the light emitting device, the time for the light from the light emitting device to arrive occurs, and as a result, dark lines are generated on the edge region.

BRIEF DESCRIPTION OF THE DRAWINGS

The embodiments will be described in detail with reference to the following drawings in which like reference numerals refer to like elements wherein.

DETAILED DESCRIPTION

Figure 1:
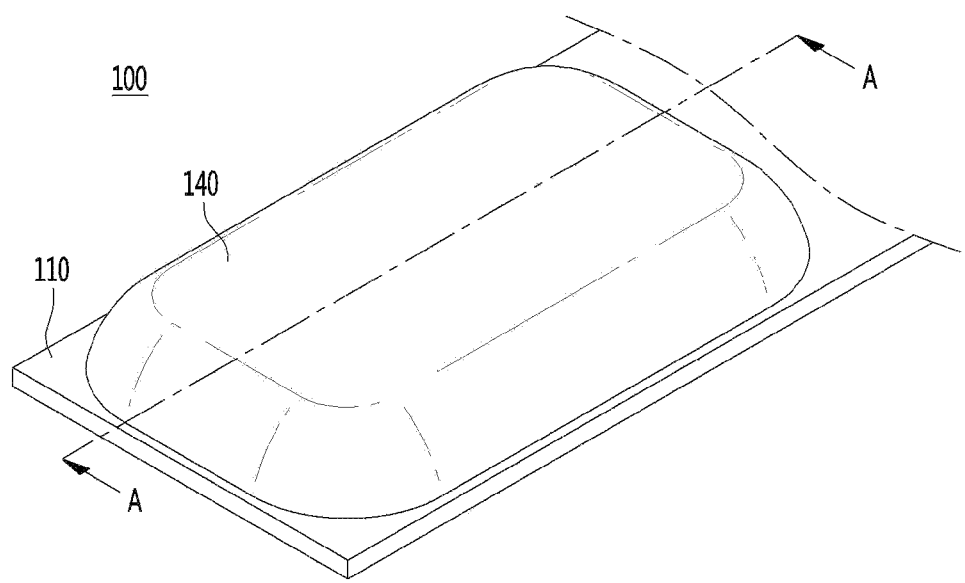
FIG. 1 is a perspective view showing a lighting device according to a first embodiment of the invention.

An object of the embodiment is to provide a lighting device for preventing dark lines from occurring.

In addition, another object of the embodiment is to provide a lighting device for uniform luminance of a surface light source.

The lighting device according to the embodiment includes a substrate, N light sources disposed on the substrate at predetermined interval, a resin layer disposed on the substrate and the light sources, and a phosphor layer disposed on the resin layer, wherein the phosphor layer includes a first region overlapped with some of the N light sources in a direction perpendicular to the substrate and including a flat region, and a second region extending from a side surface of the first region toward the substrate and including a curved surface, wherein the second region includes a first point horizontally facing the substrate at a center of a first light source closest to a side surface of the resin layer, a second point on the curved surface, and a third point facing a straight line perpendicular to the substrate at a center of the first light source, wherein a second distance from the center of the first light source to the second point is greater than a first distance from the center of the first light source to the first point and may be formed smaller than a third distance from the center of the first light source to the third point.

The first distance may include 44% to 55% of the distance between the light sources. The distance between the light sources may include 5.5 mm to 6.5 mm. A radius of curvature of the curved surface of the second region may be greater than or equal to a sum of a thickness of the resin layer and a thickness of the first region of the phosphor layer in a vertical direction of the substrate. A radius of curvature of the curved surface of the second region may include 100% to 110% of the sum of the thickness of the resin layer and the thickness of the first region of the phosphor layer in the vertical direction of the substrate. The sum of the thickness of the resin layer and the thickness of the first region of the phosphor layer in the vertical direction of the substrate may include 5.5 mm to 6.0 mm.

The N light sources may further include M light sources arranged in columns and arranged in rows. The phosphor layer is a boundary between the first region and the second region and includes a fourth point that is a point of an outer surface of the phosphor layer, and the substrate includes a fifth point of the substrate that is a shortest distance from the upper surface of the substrate to the fourth point, and wherein the fifth point of the substrate may be disposed in a region that is greater than a distance from a seventh point to the first light source closest to the first point and smaller than or equal to a radius of curvature of the curved region. The phosphor layer includes a third region perpendicular to the substrate between the second region of the phosphor layer and the substrate, the third region includes a sixth point in contact with or facing the substrate, and a distance from the center of the first light source to the sixth point may be greater than the first distance. A height of the third region based on the upper surface of the substrate may be formed to be smaller than a height of the light source. The first point, the second point, and the third point may be an outer surface of the second region of the phosphor layer.

In addition, the lighting device according to the embodiment includes a substrate, N light sources disposed on the substrate at predetermined interval, a resin layer disposed on the substrate and the light source, and a phosphor layer disposed on the resin layer. Wherein the phosphor layer includes a flat region overlapping a portion of the N light sources in a direction perpendicular to the substrate and a curved region adjacent to the flat region, wherein the phosphor layer includes a seventh point where the phosphor layer and the substrate contact or face each other, and a fourth point where the curved region and the flat region of the phosphor layer contact or face each other. The substrate includes a fifth point of the substrate that is a shortest distance from the fourth point to the upper surface of the substrate, and the fifth point of the substrate may be disposed in a region greater than a distance from the seventh point to the first light source closest to the seventh point and less than or equal to a radius of curvature of the curved region.

The fourth point may be disposed on an outer surface of the phosphor layer, and the seventh point may be disposed on an inner side surface of the phosphor layer where the phosphor layer and the resin layer contact or face each other. A thickness of the flat region of the phosphor layer may correspond to a thickness of the curved region.

In addition, the lighting device according to the embodiment includes a substrate, a plurality of light sources disposed on the substrate at predetermined intervals, a resin layer disposed on the substrate and the light source, and a phosphor layer disposed on the resin layer.

The resin layer includes an eighth point in contact with the first side surface and the edge region in a region in contact with the upper surface of the substrate, and a ninth point in which the second side surface and the edge region in contact with the upper surface of the substrate. The distance from the center of the first light source that is closest to the edge region of the resin layer to a tenth point of the outer surface of the edge region may be formed equal to a distance from the center of the first light source to the eighth point and the ninth point.

A region in which the first side surface and the upper surface of the substrate contact each other may include a straight line. The outer surface of the edge region includes an eleventh point that is the shortest distance in a direction perpendicular to the substrate from the center of the first light source, and a linear distance from the center of the first light source to the eleventh point may be formed greater than the distance from the center of the first light source to the tenth point. The phosphor layer may include red ink.

In the embodiment, since the side surface of the phosphor layer is formed to have a curved surface, it is possible to prevent dark lines from occurring at the interface between the upper surface and the side surface of the phosphor layer.

In addition, in the embodiment, since the distance between the side surface of the phosphor layer and the center of the light source is changed, there is an effect of improving the luminance uniformity of the phosphor layer.

In addition, in the embodiment, since a surface having a straight line is further formed on the side surface of the phosphor layer, the luminance of light emitted from the side surface of the phosphor layer may be further improved.

Hereinafter, preferred embodiments of the invention will be described in detail with reference to the accompanying drawings. However, the technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention.

In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

Figure 2:
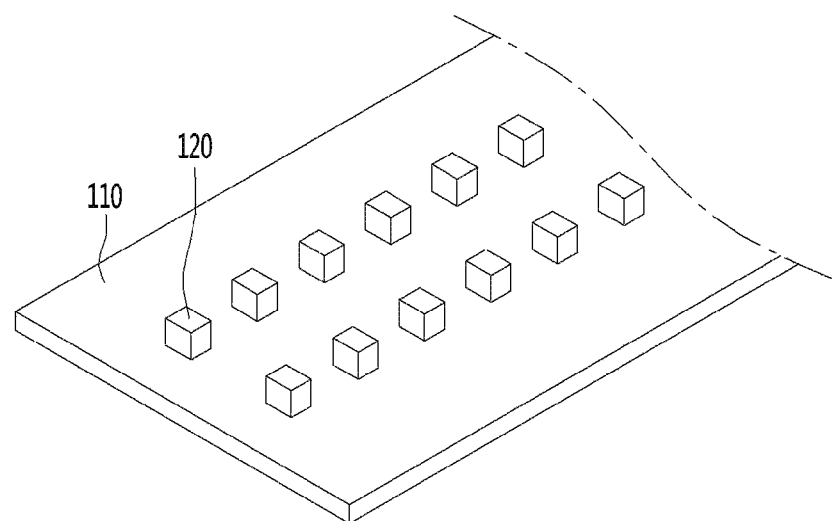
FIG. 2 is a perspective view illustrating an arrangement structure of a light source mounted on a substrate in the lighting device of FIG. 1.
Figure 3:
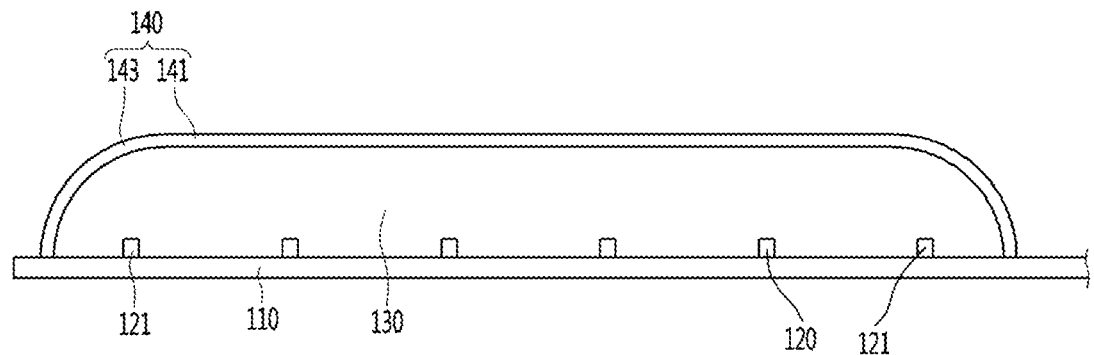
FIG. 3 is an A-A cross-sectional view of FIG. 1.
Figure 4:
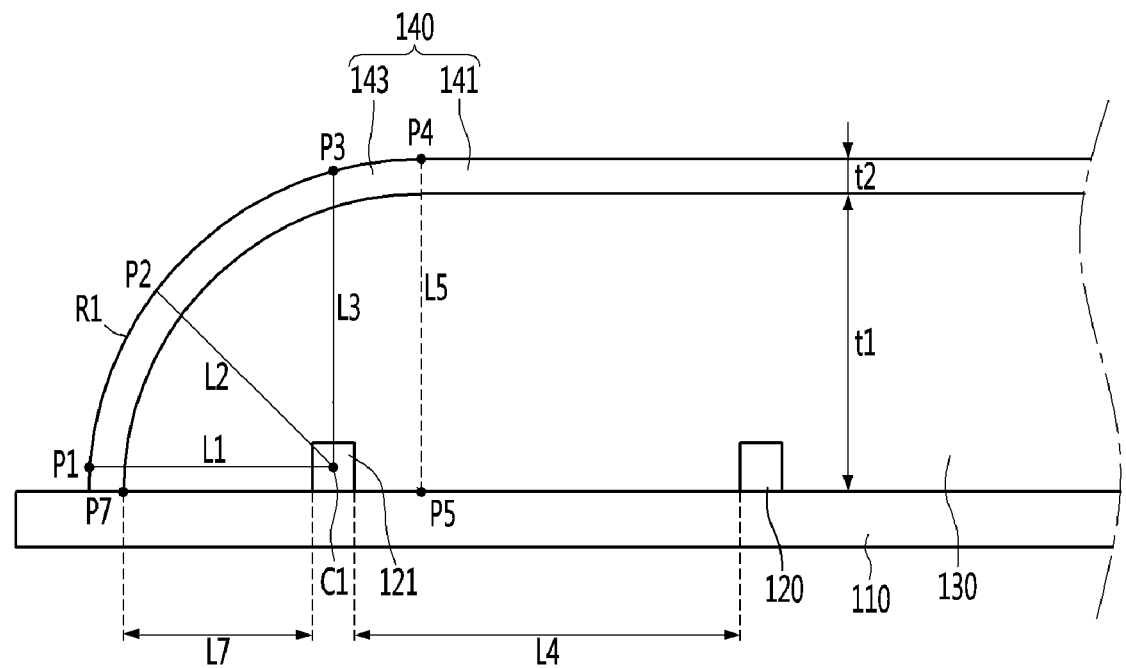
FIG. 4 is a partially enlarged view of FIG. 3.

FIG. 1 is a perspective view showing a lighting device according to a first embodiment, FIG. 2 is a perspective view for explaining an arrangement structure of a light source mounted on a substrate, FIG. 3 is an A-A cross-sectional view of FIG. 1, and FIG. 4 is partially enlarged view of FIG. 3.

As shown in FIG. 1, the lighting device 100 according to the first embodiment may have a hexahedral shape. The shape of the lighting device 100 is not limited thereto. The lighting device 100 may be formed in a structure capable of multi-faceted light emission. For example, light may be emitted from the upper surface and four side surfaces of the lighting device 100. In the above, it is illustrated that the light is emitted to five surfaces, but the present invention is not limited thereto, and light may be emitted through the lower surface.

Referring to FIGS. 1 to 3, the lighting device 100 may include a substrate (PCB: Printed circuit board) 110, a plurality of light sources 120 disposed on the substrate 110, a resin layer 130 disposed on the light source 120, and a phosphor layer 140 disposed on the resin layer 130.

The substrate 110 may include an insulating or conductive material. The substrate 110 may be formed of a rigid or flexible material. The substrate 110 may be formed of a transparent or opaque material. Electrodes of a conductive pattern may be formed on the substrate 110.

The light source 120 may be disposed on the substrate 110. N light sources 120 may be disposed in a first direction or a long axis direction of the substrate 110, and M light sources 120 may be disposed in a second direction or a short axis direction. The interval between the N light sources 120 arranged in the long axis direction of the substrate 110 may be the same or different from each other. The first direction may be a column direction, the second direction may be a row direction, and the first and second directions may be orthogonal to each other. The N is an integer of 3 or more, and the M may be an integer of 2 or more or 3 or more. The interval between the M light sources 120 arranged in the short axis direction of the substrate 110 may be the same or different from each other. A separation distance between the light sources 120 may be appropriately disposed to effectively implement a surface light source.

The light source 120 may include a light emitting device. The light source 120 may emit blue, green, red, white, infrared or ultraviolet light. The light source 120 may emit blue light, for example, in a range of 420 nm to 470 nm. The light source 120 may be provided with a compound semiconductor. The light source 120 includes a semiconductor, for example, a compound semiconductor of group II-VI or III-V elements. For example, the light source 120 may include at least two or more elements selected from aluminum (Al), gallium (Ga), indium (In), phosphorus (P), arsenic (As), and nitrogen (N).

The light source 120 may include a first conductivity type semiconductor layer, an active layer, and a second conductivity type semiconductor layer. The first and second conductivity type semiconductor layers may be implemented with at least one of compound semiconductors of group II-VI elements or group III-V elements. The first and second conductivity type semiconductor layers may be formed of, for example, a semiconductor material having a composition formula of $In_xAl_yGa_{1-x-y}N$ ($0 \le x \le 1$, $0 \le y \le 1$, $0 \le x+y \le 1$). For example, the first and second conductivity type semiconductor layers may include at least one selected from the group including GaN, AlN, AlGaN, InGaN, InN, InAlGaN, AlInN, AlGaAs, GaP, GaAs, GaAsP, AlGaInP, etc. The first conductivity type semiconductor layer may be an n-type semiconductor layer doped with an n-type dopant such as Si, Ge, Sn, Se, and Te. The second conductivity type semiconductor layer may be a p-type semiconductor layer doped with a p-type dopant such as Mg, Zn, Ca, Sr, and Ba. The active layer may be implemented as a compound semiconductor. The active layer may be implemented with at least one of compound semiconductors of group II-VI or III-V elements. When the active layer is implemented in a multi-well structure, the active layer may include a plurality of well layers and a plurality of barrier layers alternately disposed, and $In_xAl_yGa_{1-x-y}N$ ($0 \le x \le 1$, $0 \le y \le 1$, $0x+y \le 1$) may be disposed of a semiconductor material. For example, the active layer may include at least one selected from the group including InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

A reflective layer (not shown) may be further formed on the substrate 110. The reflective layer serves to guide the light generated by the light source 120 upward. The reflective layer may include a white material. The reflective layer may include a resin material. The reflective layer may include a reflective material such as $TiO_2$ in silicon or epoxy. The reflective layer may be disposed between the substrate 110 and the resin layer 130. The reflective layer may have a thickness smaller than that of the light source 120 and may reflect light emitted in a lateral direction of the light source 120.

The resin layer 130 may be disposed on the substrate 110 and the light source 120. The resin layer 130 may cover an upper surface and a side surface of each of the light sources 120. The upper surface of the resin layer 130 may be formed to be flat, and each side surface of the resin layer 130 may include a curved surface. The resin layer 130 may have a polygonal top view, and may include at least four side surfaces. The resin layer 130 may have a circular top view or an elliptical shape, and may include a side surface having a curved surface.

The upper surface of the resin layer 130 may face the lower surface of the phosphor layer 140, and the side surface of the resin layer 130 may face the side surface of the phosphor layer 140. The resin layer 130 may be a transparent resin material, for example, a resin material such as UV (Ultra violet) resin, silicone, or epoxy. The UV resin, for example, may use as a main material a resin (oligomer type) having urethane acrylate oligomer as a main raw material. For example, urethane acrylate oligomer, which is a synthetic oligomer, may be used. The main material may further include a monomer in which isobornyl acrylate (IBOA), hydroxybutyl acrylate (HBA), and hydroxy metaethyl acrylate (HEMA), which are low boiling point diluent type reactive monomers, are mixed, and as an additive, a photoinitiator (for example, 1-hydroxycyclohexyl phenyl-ketone, Diphenyl), Diphenyl (2,4,6-trimethylbenzoyl phosphine oxide), an antioxidant or the like may be mixed. The UV resin may be formed of a composition including 10 to 21% of an oligomer, 30 to 63% of a monomer, and 1.5 to 6% of an additive. In this case, the monomer may be a mixture of 10 to 21% of isobornyl acrylate (IBOA), 10 to 21% of hydroxybutyl acrylate (HBA), and 10 to 21% of hydroxy metaethyl acrylate (HEMA). The additive may be added in an amount of 1 to 5% of a photoinitiator to be able to perform a function of initiating photoreactivity, and may be formed of a mixture capable of improving yellowing by adding 0.5 to 1% of an antioxidant. The formation of the resin layer 130 using the above-described composition may form a layer with a resin such as UV resin instead of a light guide plate to adjust the refractive index and the thickness, and simultaneously, may satisfy all of adhesive characteristics, reliability and a mass production rate by using the above-described composition. The resin layer 130 may further include a beads or diffusion agent therein. The diffusion agent may have a spherical shape, and its size may range from 4 μm to 6 μm. The shape and size of the diffusion agent are not limited thereto.

Although the resin layer 130 is formed as a single layer, it may be formed as multiple layers. For example, the multi-layered resin layer 130 may include a first resin layer that does not contain impurities on the substrate 110 and a second resin layer that includes a diffusion agent on the first resin layer. Conversely, the multi-layered resin layer 130 may include a first resin layer including a diffusion agent and a second resin layer not including impurities on the substrate 110.

The phosphor layer 140 may be formed on the resin layer 130. The phosphor layer 140 may include a light-transmitting material. The phosphor layer 140 may include a transparent insulating material and a wavelength converting means therein. The phosphor layer 140 may be made of silicon, for example, may be made of silicon having different chemical combinations. The silicon is a polymer in which silicon as an inorganic material and carbon as an organic material are combined, and has thermal stability, chemical stability, abrasion resistance, gloss, etc., which are characteristics of inorganic materials and reactivity, solubility, elasticity, and processability, etc., which are characteristics of organic materials. The silicon may include general silicon and fluorine silicon having an increased fluorine ratio. Increasing the fluorine ratio of the fluorine silicone has an effect of improving moisture resistance.

The phosphor layer 140 may include a wavelength conversion means for receiving light emitted from the light source 120 and providing wavelength-converted light. For example, the phosphor layer 140 may include at least one of a phosphor or a quantum dot. The phosphor or quantum dot may emit blue, green, or red light. The phosphor may be evenly disposed inside the phosphor layer 140. The phosphor may include a phosphor of a fluoride compound, and for example, may include at least one of an MGF-based phosphor, a KSF-based phosphor, or a KTF-based phosphor. The phosphor may emit light with different peak wavelengths, and light emitted from the light source 120 may emit light with different yellow and red or different red peak wavelengths. When the phosphor is a red phosphor, the red phosphor may have a wavelength range of 610 nm to 650 nm, and the wavelength may have a width of less than 10 nm. The red phosphor may include a fluoride-based phosphor. The fluoride-based phosphor may include at least one of KSF-based red $K_2SiF_6:Mn^{4+}$, $K_2TiF_6:Mn^{4+}$, $NaYF_4:Mn^{4+}$, $NaGdF_4:Mn^{4+}$, $K_3SiF_7:Mn^{4+}$. The KSF-based phosphor, for example, may have a composition formula of $K_aSi_{1-c}F_b:Mn^{4+}_c$, wherein the a may satisfy $1 \leq a \leq 2.5$, the b may satisfy $5 \leq b \leq 6.5$, and the c may satisfy $0.001 \leq c \leq 0.1$.

In addition, the fluoride-based red phosphor may be coated with a fluoride containing no Mn, or an organic material coating may be further included on the surface of the phosphor or the surface of the fluoride coating containing no Mn in order to improve reliability at high temperature/high humidity. In the case of the fluoride-based red phosphor as described above, unlike other phosphors, since a width of 10 nm or less may be realized, it may be used in a high-resolution device. The phosphor composition according to the embodiment should basically conform to stoichiometry, and each element may be substituted with another element in each group on the periodic table. For example, Sr may be substituted with Ba, Ca, Mg, etc. of the alkaline earth II group, and Y may be substituted with Tb, Lu, Sc, Gd of the lanthanum series. In addition, Eu or the like as an activator may be substituted with Ce, Tb, Pr, Er, Yb, etc. according to a desired energy level, and a sub-activator or the like may be additionally applied to the activator alone or to modify properties.

The quantum dots may include a compound semiconductor of group II-VI or a group III-V compound, and may emit red light. The quantum dots may be, for example, ZnS, ZnSe, ZnTe, CdS, CdSe, CdTe, GaN, GaP, GaAs, GaSb, InP, InAs, In, Sb, AlS, AlP, AlAs, PbS, PbSe, Ge, Si, $CuInS_2$, $CuInSe_2$ and the like, and combinations thereof.

The phosphor layer 140 may include a phosphor and colored ink. The phosphor layer 140 may include red ink therein. In the red ink, when the light source 120 is not turned on, the outer surface of the lighting device 140 may be viewed in red. That is, when the light is turned on or not, the lighting device 100 is all displayed in red, thereby preventing a sense of heterogeneity due to color difference. The red ink may include red powder or red ink particles.

The phosphor layer 140 may include a first region 141 disposed on the resin layer 130 and a second region 143 disposed on a side surface of the resin layer 130. The first region 141 of the phosphor layer 140 may overlap some of the N light sources 120 in a direction perpendicular to the substrate 110. The first region 141 of the phosphor layer 140 may not overlap in a vertical direction with a portion of at least one light source 120 disposed on the outermost side of the substrate 110.

The first region 141 of the phosphor layer 140 may be disposed parallel to the upper surface of the substrate 110. The width of the first region 141 of the phosphor layer 140 may be smaller than the width of the substrate 110. An edge of the first region 141 of the phosphor layer 140 may be disposed inside the side surface of the substrate 110. The upper or lower surface of the first region 141 of the phosphor layer 140 may include a flat surface.

The second region 143 of the phosphor layer 140 may extend from an edge of the first region 141 of the phosphor layer 140 toward the substrate 110. The second region 143 of the phosphor layer 140 may include a curved surface. The second region 143 may be disposed more outside than an imaginary straight line connecting from the edge of the first region 141 to the lower end of the phosphor layer 140. The second region 143 of the phosphor layer 140 may include a curved surface having a convex shape from the inside of the resin layer 130 toward the outside. The second region 143 of the phosphor layer 140 may be formed to overlap the light source 120 disposed at the outermost side of the upper portion of the substrate 110 and the substrate 110 in a vertical direction. In an embodiment, the thickness of the first region 141 of the phosphor layer 140 and the thickness of the second region 143 of the phosphor layer 140 may be the same. As another example, the thickness of the first region 141 may be thicker than the thickness of the second region 143.

Since the side portion of the phosphor layer 140 is formed to have a curved surface, the distance between the edge region of the phosphor layer 140 and the light source 120 disposed at the outermost side of the substrate 100 is reduced, and it is possible to prevent the occurrence of dark lines at the boundary region between the first region 141 and the second region 143 of the phosphor layer 140. In the comparative example, the polygonal phosphor layer may have dark lines at the corners between the upper and side surfaces. According to the embodiment of the invention, dark lines at an edge portion of an upper surface of a phosphor layer having a curved side surface and an upper surface may be removed.

Although the arrangement structure of the light source, the resin layer, and the phosphor layer has been mainly described, a relationship among the distance between the light source and the phosphor layer, the radius of curvature of the second region of the phosphor layer, and the thickness of the resin layer and the phosphor layer may be important. Hereinafter, each component of the lighting device will be described in detail.

As shown in FIG. 4, the light source 120 overlaps the first region 141 of the phosphor layer 140 in a vertical direction, and may include a first light source 121 overlapped with the second region 143 of the phosphor layer 140 in a vertical direction. The first light source 121 may be disposed outer than a light source overlapping the first region 141 in a vertical direction, or may be closer to the curved surface of the resin layer 130. Here, the first light source 121 may be a light source disposed closest to a side surface or an outer curved surface of the resin layer 130 among the plurality of light sources 120 disposed on the substrate 100.

Each side surface of the resin layer 130 may be curved. Each side surface of the resin layer 130 may be convex outward than an imaginary straight line connecting the upper and lower edges of the resin layer 130. Each side surface of the resin layer 130 may be a convex curved surface, and the convex curved surface may be disposed along a circumference of the resin layer 130. A boundary portion or a corner portion between side surfaces of the resin layer 130 may be curved.

The second region 143 of the phosphor layer 140 may include a curved surface. The second region 143 of the phosphor layer 140 may include a first point P1, a second point P2, and a third point P3. The first point P1, the second point P2, and the third point P3 may be points on the outer surface of the second region 143 of the phosphor layer 140. The outer surface of the second region 143 may include the first point P1, the second point P2, and the third point P3. The first point P1 may be adjacent to the substrate 110 on the surface of the phosphor layer 140 and may be disposed outside the first light source 121. The first point P1 may be disposed lower than a horizontal straight line on the upper surface of the first light source 121. The second point P2 may be disposed at a position higher than the upper surface of the light source 120, and may be disposed inside the vertical virtual straight line passing through the first point P1. The third point P3 may be closer to the first region 141 than the second point P2 and may be disposed inward than a vertical virtual straight line passing through the second point P2.

The first point P1 may be a position where it contacts or crosses the outer surface of the second region 143 of the phosphor layer 140 in a horizontal direction of the substrate 110 from the center C1 of the first light source 121. The third point P3 may be a position where it contacts or crosses a straight line perpendicular to the substrate 110 and the outer surface of the second region 143 of the phosphor layer 140 from the center C1 of the first light source 121. The second point P2 may be any one region between the first point P1 and the third point P3 of the second region 143 of the phosphor layer 140. The first point P1 and the third point P3 may be points that intersect a horizontal straight line and a vertical straight line based on the center C1 of the first light source 121.

A first distance L1 from the center C1 of the first light source 121 to a first point P1, and a second distance L2 from the center C1 of the first light source 121 to the second point P2, a third distance L3 from the center C1 of the first light source 121 to the third point P3 may be different from each other. The third distance L3 from the center C1 of the first light source 121 to the third point P3 may be formed larger than the first distance L1 from the center C1 of the first light source 121 to the first point P1 and the second distance L2 from the center C1 of the first light source 121 to the second point P2. The second distance L2 from the center C1 of the first light source 121 to the second point P2 may be formed lager than the first distance L1 from the center C1 of the first light source 121 to the first point P1.

To explain the conventional problem, when the side surface of the resin layer 140 is not curved, the second distance L2 between the center C1 of the first light source 121 disposed at the outermost side of the light sources and the second point P2 may be formed significantly farther than the third distance L3 between the center C1 of the first light source 121 and the third point P3 and the first distance L1 between the center C1 of the first light source 121 and the first point P1. Since the distance between the second point P2 and the first light source 121 is relatively increased, there is a problem that dark lines are generated from the second point P2 and a periphery of the second point P2.

In the embodiment, the second region 143 of the phosphor layer 140 is formed to have a curved surface so that the second distance L2 between the center C1 of the first light source 121 and the second point P2 is reduced. As a result, there is an effect of preventing the occurrence of dark lines. In addition, the embodiment is to improve the light uniformity of the side of the phosphor layer 140 by forming a curved surface so that there is little difference between the values of the first distance L1, the second distance L2, and the third distance L3. In addition, uniformity of light between the upper surface and side surface of the phosphor layer 140 may be improved. In practice, there is a difference in the distance values of the first distance L1, the second distance L2, and the third distance L3, but the difference between the distance values is very small as it goes toward the upper surface and side surface of the phosphor layer 140. Therefore, it is difficult to recognize the difference in luminance when viewed from the outside thereof.

The first distance L1 between the center C1 of the first light source 121 and the first point P1 may be determined according to the distance between the first light sources 121. The first light source 121 may be disposed such that a distance L4 between the first light source 121 and a light source adjacent thereto is in a range of 5.5 mm to 6.5 mm. When the distance L4 between the first light source 121 and a light source adjacent thereto exceeds 6.5 mm, a hot spot may occur in a region where the first light source 121 is disposed when viewed from the outside.

The first light source so that the first distance L1 between the center C1 of the first light source 121 and the first point P1 is 44% to 55% of the fourth distance L4 between two adjacent light sources. 121 may be placed. For example, the first distance L1 between the center C1 of the first light source 121 and the first point P1 may be determined to be around 3 mm. When the first distance L1 between the center C1 of the first light source 121 and the first point P1 is less than 44% or exceeds 55% of the fourth distance L4, the light emitted through the second region 143 of the phosphor layer 140 may appear too bright or dark, resulting in a problem in that light uniformity is deteriorated.

The radius of curvature R1 of the second region 143 of the phosphor layer 140 may be determined according to the thickness of the phosphor layer 140 and the resin layer 130. The radius of curvature R1 of the second region 143 of the phosphor layer 140 may be formed equal to or greater than the sum of the thickness t1 of the resin layer 130 and a thickness t2 of the first region 141 of the phosphor layer 140. For example, the radius of curvature R1 of the second region 143 of the phosphor layer 140 may be formed to be 100% to 110% of the sum of the thickness t1 of the resin layer 130 and the thickness t2 of the first region 141 of the phosphor layer 140 in a direction perpendicular to the substrate 110. The thickness t1 of the resin layer 130 in the vertical direction may be a maximum thickness.

Here, the thickness t1 of the resin layer 130 may be 5.0 mm to 5.5 mm, and the thickness t2 of the first region 141 of the phosphor layer 140 may be 0.5 mm. Accordingly, a radius of curvature R1 of the second region 143 of the phosphor layer 140 may be 5.5 mm to 6.0 mm. Here, when the thickness t2 of the first region 141 of the phosphor layer 140 is formed to be less than 0.5 mm, the light efficiency may be increased. Since the process of forming the thickness t2 of the first region 141 of the phosphor layer 140 to less than 0.5 mm is practically difficult, it is effective to form the thickness t2 of the first region 141 of the phosphor layer 140 to be at least minimal.

In addition, the phosphor layer 140 may include a fourth point P4 between the first region 141 and the second region 143. The fourth point P4 may be disposed in a region of the outer surface of the phosphor layer 140. In addition, a fifth point P5 may be disposed on the substrate 110 having the shortest distance and the fourth point P4.

The distance L5 between the fourth point P4 of the phosphor layer 140 and the fifth point P5 of the substrate 110 may be greater than the first distance L1 from the first point P1 of the second region 143 of the phosphor layer 140 to the first light source 120. In addition, the distance L5 between the fourth point P4 of the phosphor layer 140 and the fifth point P5 of the substrate 110 may be formed to be less than or equal to a radius of curvature R1 of the second region 143 of the phosphor layer 140.

The phosphor layer 140 may include a seventh point P7 where the second region 143 of the phosphor layer 140 and the substrate 110 contact each other. The seventh point P7 may be an inner surface of the phosphor layer 140 where the second region 143 of the phosphor layer 140 and the resin layer 130 contact or face each other.

The distance L7 between the seventh point P7 of the second region 143 of the phosphor layer 140 and the side surface of the light source 120 may be formed smaller than the distance L4 between the light sources 120. The fifth point P5 formed on the substrate 110 may be disposed within a region that is greater than the distance from the seventh point P7 to the first light source 120 and is less than or equal to the radius of curvature R1.

As described above, the radius of curvature R1 of the second region 143 of the phosphor layer 140 may be determined through various conditions of the lighting device 100.

Figure 5:
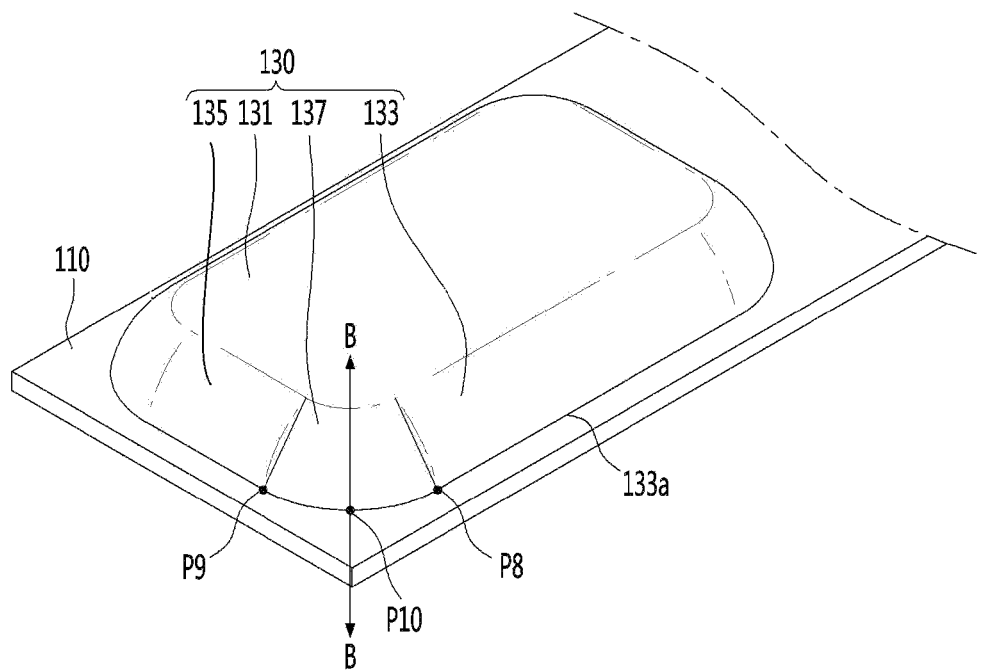
FIG. 5 is a perspective view illustrating a lighting device in a state in which a phosphor layer is removed from the lighting device of FIG. 1.
Figure 6:
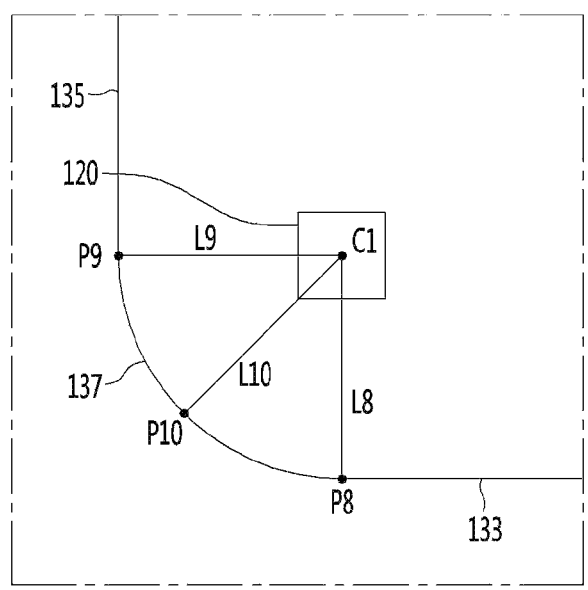
FIG. 6 is a plan view illustrating a relationship according to a distance between a light source and a resin layer in the lighting device of FIG. 5.
Figure 7:
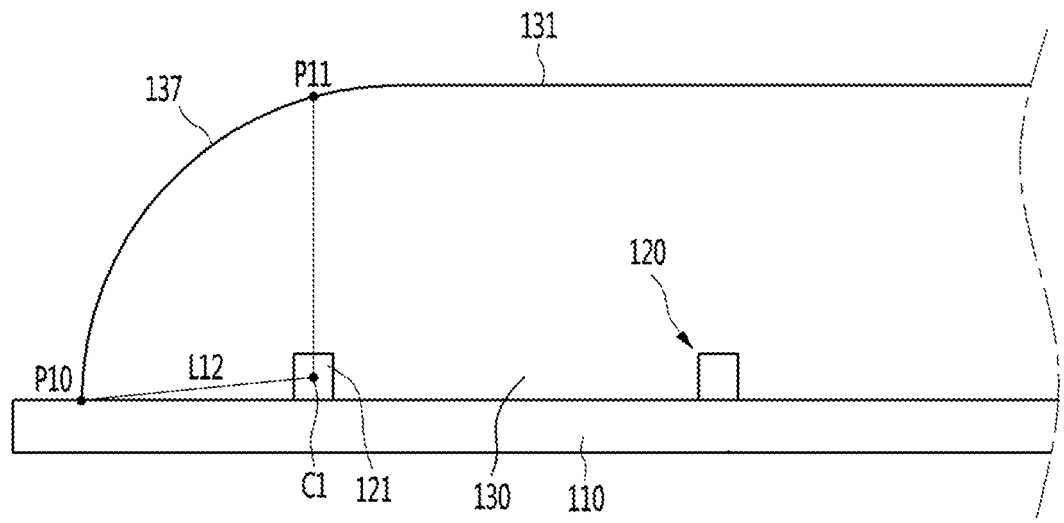
FIG. 7 is a B-B cross-sectional view of the lighting device of FIG. 6.

FIG. 5 is a perspective view illustrating a lighting device in a state in which the phosphor layer is removed from the lighting device of FIG. 1, and FIG. 6 is a plan view illustrating a relationship according to a distance between a light source and a resin layer in the lighting device of FIG. 5, and FIG. 7 is a cross-sectional view taken along B-B side in FIG. 5.

As shown in FIG. 5, the resin layer 130 includes a flat upper surface 131, a first side surface 133 bent toward the substrate 110 from the upper surface 131, and a second side surface 135 disposed adjacent to the first side surface 133, and an edge region 137 disposed between the first side surface 133 and the second side surface 135. Here, the first side surface 133, the second side surface 135, and the edge region 137 may include a curved surface.

The upper surface 131 of the resin layer 130 may be in contact with the lower portion of the first region of the phosphor layer. The side surfaces 133 and 135 and the edge regions 137 of the resin layer 130 may contact the second region of the phosphor layer. That is, the upper surface 131, the side surfaces 133 and 135, and the edge regions 137 of the resin layer 130 may be formed in a shape corresponding to the inner surface of the phosphor layer.

The resin layer 130 may include an eighth point P8 where the first side surface 133 and the edge region 137 of the resin layer 130 contact or face the upper surface of the substrate 110. The resin layer 130 may include a ninth point P9 in which the second side surface 135 and the edge region 137 contact or correspond to the upper surface of the substrate 110 in a region that contacts or faces the upper surface of the substrate 110. The resin layer 130 may include a tenth point P10 that is an outer surface of the edge region 137 in a region that contacts or faces the upper surface of the substrate 110. Here, a region in which the resin layer 130 and the upper surface of the substrate 110 contact or face may include a straight line 133a.

As shown in FIG. 6, the distance L10 from the center C1 of the first light source 120 adjacent to the edge region 137 of the resin layer 130 to the tenth point P10 of the edge region 137 may be formed equal to the distance L8 from the center C1 of the first light source 120 to the eighth point P8 of the resin layer 130.

The distance L10 from the center C1 of the first light source 120 adjacent to the edge region 137 of the resin layer 130 to the tenth point P10 of the edge region 137 may be formed equal to the distance L9 from the center C1 of the first light source 120 to the ninth point P9 of the resin layer 130.

Accordingly, the light emitted from the edge region 137 of the resin layer 130 may be emitted to have the same luminance as the light emitted from the first side 133 and the second side 135 of the resin layer 130.

As shown in FIG. 7, the outer surface of the edge region 137 of the resin layer 130 may include an eleventh point P11 which is the shortest distance perpendicular to the substrate 110 from the center C1 of the first light source 120. Accordingly, the line distance L11 from the center C1 of the first light source 120 to the eleventh point P11 may be formed lager than the distance L10 from the center C1 of the first light source 120 to the tenth point P10. That is, the distance from the first light source 120 to the edge region 137 of the resin layer 130 may increase toward the upper surface of the resin layer 130, similar to the side surfaces of the resin layer 130. Here, when a reflective layer is disposed between the substrate 110 and the resin layer 130, each of the points P5 and P7 disposed on the substrate 110 may be positioned to the reflective layer or may be in contact with the reflective layer, and may be a point closest to the substrate 110. When the reflective layer is disposed between the substrate 110 and the lower end of the phosphor layer 140, the lower end of the phosphor layer 140 may be in contact with the reflective layer or may be a point closest to the substrate 110. The reflective layer may be an upper layer of the substrate 110.

Comparing the lighting device according to the embodiment of the invention and the conventional lighting device, when the conventional lighting device is formed of a polyhedron, it may be seen that dark lines occur in the boundary region between a surface and a surface. On the other hand, it may be seen that the lighting device of the embodiment may prevent the occurrence of dark lines by forming the boundary region between the surface and the surface in a curved surface. In addition, by forming the side surface of the lighting device to have a curved surface, it may be seen that the overall light luminance of the lighting device is uniform.

Figure 8:
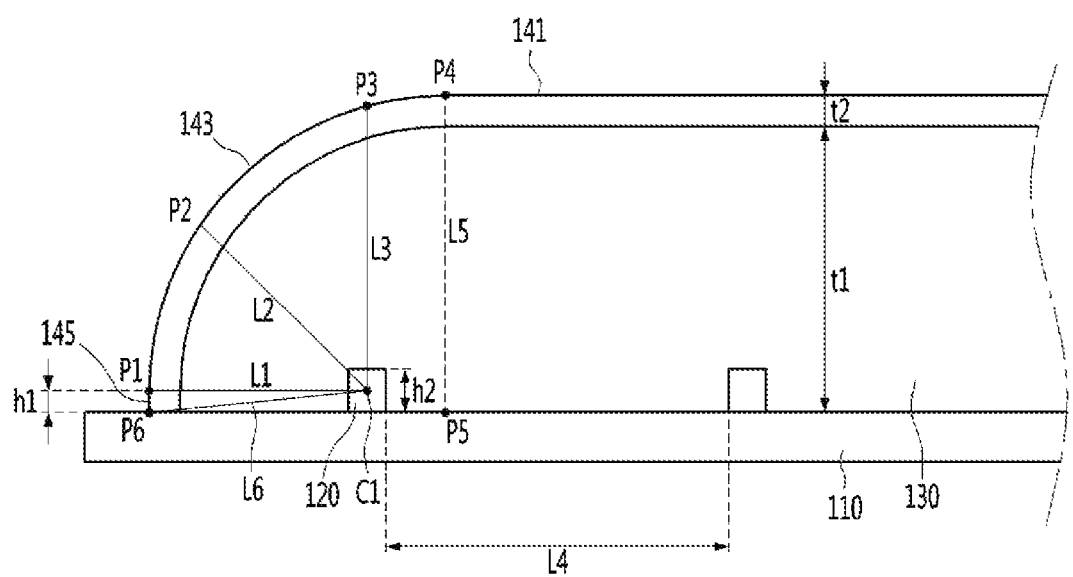
FIG. 8 is a cross-sectional view showing a lighting device according to a second embodiment of the present invention.

FIG. 8 is a cross-sectional view showing a lighting device according to a second embodiment. In the description of the second embodiment, the second embodiment may include the same configuration and description as the first embodiment, and redundant descriptions will be omitted.

Referring to FIG. 8, the lighting device 100 according to the second embodiment may include a substrate 110, a plurality of light sources 120 disposed on the substrate 110, and a a resin layer 130 disposed on the light source 120, and a phosphor layer 140 disposed on the resin layer 130.

The substrate 110 may include an insulating or conductive material. The substrate 110 may be formed of a rigid or flexible material. The substrate 110 may be formed of a transparent or opaque material. Electrodes of a conductive pattern may be formed on the substrate 110. The substrate 110 may be designed in various ways according to the purpose of use.

The light source 120 may be disposed on the substrate 110. The light source 120 may include a light emitting device. As for the light source 120, N light sources 120 may be disposed in a direction of a long axis (column) of the substrate 110, and M light sources 120 may be disposed in a direction of a short axis (row) of the substrate 110. The resin layer 130 may be disposed on the substrate 110 and the light source 120. The resin layer 130 may be formed to cover the upper and side surfaces of the plurality of light sources 120. The phosphor layer 140 may be disposed on the resin layer 130.

The phosphor layer 140 may include a first region 141 formed on the resin layer 130, a second region 143 disposed on a side surface of the resin layer 130, and a third region 145 disposed between the substrate 110 the second region 143.

The first region 141 of the phosphor layer 140 may overlap some of the N light sources 120 in a direction perpendicular to the substrate 110. The first region 141 of the phosphor layer 140 may be disposed parallel to the upper surface of the substrate 110. The first region 141 of the phosphor layer 140 may include a flat surface.

The second region 143 of the phosphor layer 140 may extend toward the substrate 110 from a side surface of the first region 141 of the phosphor layer 140. The second region 143 of the phosphor layer 140 may include a curved surface. The second region 143 of the phosphor layer 140 may include a curved surface convex to the outside. The third region 145 of the phosphor layer 140 may be vertically disposed between the second region 143 of the phosphor layer 140 and the substrate 110. One side of the third region 145 of the phosphor layer 140 is in contact with the second region 143 of the phosphor layer 140 and the other side of the third region 145 of the phosphor layer 140 may be in contact with or face the upper surface of the substrate 110. The height h1 of the third region 145 of the phosphor layer 140 may be smaller than the height h2 of the light source 120 or the first light source 121.

In the embodiment, the thickness of the first region 141 of the phosphor layer 140, the thickness of the second region 143 of the phosphor layer 143 and the thickness of the third region 145 of the phosphor layer 140 may be formed to correspond to each other. The second region 143 of the phosphor layer 140 may include a first point P1, a second point P2, and a third point P3. The first point P1, the second point P2, and the third point P3 may be an outer surface of the second region 143 of the phosphor layer 140.

The first point P1 may be a region in which the first point P1 is in contact with or facing the outer surface of the second region 143 of the phosphor layer 140 in a horizontal direction to the substrate 110 at the center C1 of the first light source 121 which is most adjacent to the side surface of the resin layer 130. The first point P1 may be a region in which the second region 143 and the third region 145 of the phosphor layer 140 contact or face each other. The second point P2 may be any one region of an outer surface of the second region 143 of the phosphor layer 140. The third point P3 may a region in which the third point P3 contacts or faces a straight line perpendicular to the substrate 110 and an outer surface of the second region 143 of the phosphor layer 140 from the center C1 of the first light source 121.

A first distance L1 between the center C1 of the first light source 121 and the first point P1, a second distance L2 between the center C1 of the first light source 121 and the second point P2, and a third distance L3 between the center C1 of the first light source 121 and the third point P3 may be formed differently from each other.

The third distance L3 from the center C1 of the first light source 121 to the third point P3 may be formed larger than the first distance L1 from the center C1 of the first light source 121 to the first point P1 and the second distance L2 from the center C1 of the first light source 121 to the second point P2. The second distance L2 between the center C1 of the first light source 121 and the second point P2 may be formed larger than the second distance L2 from the center C1 of the first light source 121 to the first point P1.

The phosphor layer 140 may include a fourth point P4 between the first region 141 and the second region 143. The fourth point P4 may be disposed on the outer surface of the phosphor layer 140. A fifth point P5 may be included on the substrate 110 at the shortest distance from the fourth point P4. The distance L5 between the fourth point P4 of the phosphor layer 140 and the fifth point P5 of the substrate 110 may be greater than a distance the first point P1 of the second region 143 of the phosphor layer 140 to the first light source 121. The distance L5 between the fourth point P4 of the phosphor layer 140 and the fifth point P5 of the substrate 110 may be smaller than or equal to the radius of curvature R1 of the second region 143 of the phosphor layer 140.

The third region 145 of the phosphor layer 140 may include a sixth point P6. The sixth point P6 may be a region in which an outer surface of the third region 145 of the phosphor layer 140 and an upper surface of the substrate 110 contact or face each other. The distance L6 from the center C1 of the first light source 121 to the sixth point P6 may be greater than the distance L1 from the center C1 of the first light source 121 to the first point P1. When a reflective layer is disposed between the substrate 110 and the resin layer 130, each of the points P5 and P7 disposed on the substrate 110 may be positioned to the reflective layer or may be in contact with the reflective layer, and may be a point closest to the substrate 110. When the reflective layer is disposed between the substrate 110 and the lower end of the phosphor layer 140, the lower end of the phosphor layer 140 may be in contact with the reflective layer or may be a point closest to the substrate 110. The reflective layer may be an upper layer of the substrate 110.

The lighting device according to the second embodiment has a phosphor layer 140 having a straight line perpendicular to the top surface of the substrate 110 on the side of the resin layer 130, and therefore it has the effect that luminance of the light emitted to the side surface may be formed more uniformly.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A lighting device comprising:
    a substrate;
    a plurality of light sources disposed on the substrate;
    a resin layer disposed on the substrate and sealing the plurality of light sources; and
    a light transmitting layer disposed on the resin layer,
    wherein a surface of the resin layer has an upper surface and a plurality of side surfaces,
    wherein at least one of the plurality of side surfaces of the resin layer has a convex curved surface,
    wherein the light transmitting layer has a first region disposed on the upper surface of the resin layer and a second region disposed on the plurality of side surfaces of the resin layer,
    wherein the second region extends from an end of the first region toward the substrate and including a convex curved surface,
    wherein three or more of the plurality of light sources are arranged in the resin layer in a column direction,
    wherein three or more of the plurality of light sources are arranged in the resin layer in a row direction,
    wherein the plurality of light sources includes a first light source arranged to an outermost side of the light sources,
    wherein the first region of the light transmitting layer is parallel to the upper surface of the resin layer,
    wherein the convex curved surface of the resin layer and the second region of the light transmitting layer overlap the first light source in a vertical direction perpendicular to an upper surface of the substrate,
    wherein a number of light sources vertically overlapping the first region of the light transmitting layer among the plurality of light sources is greater than a number of the first light source,
    wherein a corner between two adjacent side surfaces of the plurality of side surfaces of the resin layer has a convex curved surface,
    wherein a radius of curvature of the second region of the light transmitting layer is greater than a sum of a maximum thicknesses of the resin layer and a thickness of the light transmitting layer in the vertical direction, and
    wherein an inner side of the first light source is disposed further outside than a straight line perpendicular to a boundary point between the first region and the second region of the light transmitting layer.

2. The lighting device of claim 1, wherein each of the plurality of side surfaces of the resin layer has a convex curved surface,
    wherein the light transmitting layer is in physical contact with the surface of the resin layer.

3. The lighting device of claim 1, wherein a distance between a center of the first light source and an outer surface of the light transmitting layer in the vertical direction is greater than a minimum distance between the center of the first light source and an outer surface of the light transmitting layer in a horizontal direction.

4. The lighting device of claim 3, wherein the minimum distance between the center of the first light source and the outer surface of the light transmitting layer in the horizontal direction is smaller than a distance between two adjacent light sources.

5. The lighting device of claim 4, wherein the minimum distance between the center of the first light source and the outer surface of the light transmitting layer in the horizontal direction is in a range of 44% to 55% of the distance between two adjacent light sources.

6. The lighting device of claim 5, wherein the distance between adjacent light sources is in a range of 5.5 mm to 6.5 mm.

7. The lighting device of claim 1, wherein the radius of curvature of the second region of the light transmitting layer is in a range of 5.5 mm to 6.0 mm.

8. The lighting device of claim 1, wherein the light transmitting layer includes a red ink.

9. The lighting device of claim 1, wherein the light transmitting layer includes a red phosphor and a red ink.

10. A lighting device comprising:
    a flexible substrate;
    a plurality of light sources disposed on the substrate and electrically connected to the substrate;
    a resin layer disposed on the substrate and sealing the plurality of light sources; and
    a light transmitting layer disposed on the resin layer and including a phosphor,
    wherein a surface of the resin layer has an upper surface and a plurality of side surfaces,
    wherein the plurality of side surfaces of the resin layer has a convex curved surface,
    wherein the light transmitting layer has a first region disposed on the upper surface of the resin layer and a second region disposed on the plurality of side surfaces of the resin layer,
    wherein the second region extends from an end of the first region toward the substrate and including a convex curved surface,
    wherein three or more of the plurality of light sources are arranged in the resin layer in a column direction,
    wherein three or more of the plurality of light sources are arranged in the resin layer in a row direction,
    wherein the plurality of light sources includes a first light source arranged to an outermost side of the light sources,
    wherein the first region of the light transmitting layer is parallel to the upper surface of the resin layer,
    wherein the convex curved surface of the resin layer and the second region of the light transmitting layer overlap the first light source in a vertical direction perpendicular to an upper surface of the substrate,
    wherein a number of light sources vertically overlapping the first region of the light transmitting layer among the plurality of light sources is greater than a number of the first light source,
    wherein a plurality of corners between two adjacent side surfaces of the plurality of side surfaces of the resin layer has a convex curved surface,
    wherein a radius of curvature of the second region of the light transmitting layer is greater than a sum of a maximum thicknesses of the resin layer and a thickness of the light transmitting layer in the vertical direction, and
    wherein an inner side of the first light source is disposed further outside than a straight line perpendicular to a boundary point between the first region and the second region of the light transmitting layer.

11. The lighting device of claim 10,
    wherein the light transmitting layer includes a red ink.

12. The lighting device of claim 10, wherein a distance between a center of the first light source and an outer surface of the light transmitting layer in the vertical direction is greater than a minimum distance between the center of the first light source and an outer surface of the light transmitting layer in a horizontal direction.

13. The lighting device of claim 12, wherein the minimum distance between the center of the first light source and the outer surface of the light transmitting layer in the horizontal direction is smaller than a distance between two adjacent light sources.

14. The lighting device of claim 13, wherein the minimum distance between the center of the first light source and the outer surface of the light transmitting layer in the horizontal direction is in a range of 44% to 55% of the distance between two adjacent light sources.

15. The lighting device of claim 14, wherein the distance between adjacent light sources is in a range of 5.5 mm to 6.5 mm.

16. The lighting device of claim 10, wherein the radius of curvature of the second region of the light transmitting layer is in a range of 5.5 mm to 6.0 mm.

17. The lighting device of claim 10, wherein the sum of the thickness of the resin layer and the thickness of the first region of the light transmitting layer in the vertical direction is in a range of 5.5 mm to 6.0 mm.

18. The lighting device of claim 10, wherein an entire upper surface of the first light source overlaps the second region of the light transmitting layer in the vertical direction, and wherein the light transmitting layer is in physical contact with the surface of the resin layer.

19. The lighting device of claim 1, wherein the sum of the thickness of the resin layer and the thickness of the first region of the light transmitting layer in the vertical direction is in a range of 5.5 mm to 6.0 mm.

20. The lighting device of claim 1, wherein an entire upper surface of the first light source overlaps the second region of the light transmitting layer in the vertical direction.

* * * * *